United States Patent
Suzuki

(12) 
(10) Patent No.: US 12,068,578 B2
(45) Date of Patent: Aug. 20, 2024

(54) LIGHT EMITTING MODULE

(71) Applicant: NICHIA CORPORATION, Anan (JP)

(72) Inventor: Takuya Suzuki, Naruto (JP)

(73) Assignee: NICHIA CORPORATION, Anan (JP)

( * ) Notice: Subject to any disclaimer, the term of this patent is extended or adjusted under 35 U.S.C. 154(b) by 404 days.

(21) Appl. No.: 17/578,462

(22) Filed: Jan. 19, 2022

(65) Prior Publication Data

US 2022/0239065 A1 Jul. 28, 2022

(30) Foreign Application Priority Data

Jan. 27, 2021 (JP) ................. 2021-010873

(51) Int. Cl.
*H01S 5/068* (2006.01)
*F21S 41/16* (2018.01)
*H01S 5/02257* (2021.01)

(52) U.S. Cl.
CPC .......... *H01S 5/06825* (2013.01); *F21S 41/16* (2018.01); *H01S 5/02257* (2021.01)

(58) Field of Classification Search
CPC ......... F21S 41/16; F21S 45/70; H01S 5/0087; H01S 5/02208–02257; H01S 5/042; H01S 5/06825–0683
See application file for complete search history.

(56) References Cited

U.S. PATENT DOCUMENTS

| | | | |
|---|---|---|---|
| 10,389,439 | B2 | 8/2019 | Richter et al. |
| 2008/0198055 | A1 | 8/2008 | Matsubayashi |
| 2016/0301202 | A1 | 10/2016 | Tsukamoto et al. |
| 2017/0093272 | A1 | 3/2017 | Wakaiki et al. |
| 2019/0149035 | A1 | 5/2019 | Kubouchi |
| 2019/0305503 | A1 | 10/2019 | Osawa et al. |
| 2019/0323678 | A1 | 10/2019 | Suzuki et al. |
| 2019/0390838 | A1 | 12/2019 | Yamaguchi |

FOREIGN PATENT DOCUMENTS

| | | |
|---|---|---|
| JP | 2008-205824 | 9/2008 |
| JP | 2013-191479 | 9/2013 |
| JP | 2015-050553 | 3/2015 |
| JP | 2016-122715 | 7/2016 |
| JP | 2017-070114 | 4/2017 |
| JP | 2019-092284 | 6/2019 |
| JP | 2019-176076 | 10/2019 |
| JP | 2019-192744 | 10/2019 |
| JP | 2019-220445 | 12/2019 |

*Primary Examiner* — Jason M Han
(74) *Attorney, Agent, or Firm* — MORI & WARD, LLP

(57) ABSTRACT

A light-emitting module including: a laser element; a converting member; a sense wiring; an electric potential determining circuit configured to output a first value when an electric potential at a first end of the sense wiring is in a predetermined range, and to output a second value when the electric potential at the first end of the sense wiring is out of the predetermined range; a first switching element electrically connected in series to the laser element, the first switching element configured to become conductive when the output is the first value, and to become non-conductive when the output is the second value; and a second switching element electrically connected in parallel to a circuit comprising the laser element and the first switching element, the second switching element configured to become conductive when the output is the second value, and to become non-conductive when the output is the first value.

14 Claims, 3 Drawing Sheets

FIG. 4

| mode | First node Na | First comparator 41 | Second comparator 42 | Third comparator 43 | Fourth comparator 44 | Second node Nb | First transistor 33 | Third node Nc | Second switching element 32 | First switching element 31 | Laser element 14 | Row |
|---|---|---|---|---|---|---|---|---|---|---|---|---|
| normal | Within normal range | H | H | H | H | H | ON | L | OFF | ON | ON | 1 |
| | | NG | H | H | H | H | ON | L | OFF | ON | ON | 2 |
| | | H | NG | H | H | H | ON | L | OFF | ON | ON | 3 |
| | | H | H | NG | H | H | ON | L | OFF | ON | ON | 4 |
| | | H | H | H | NG | H | ON | L | OFF | ON | ON | 5 |
| | | H | H | H | H | H | NG | L | ON | ON | OFF | 6 |
| | | H | H | H | H | H | ON | L | NG | ON | ON | 7 |
| | | H | H | H | H | H | ON | L | OFF | NG | OFF | 8 |
| open | Higher than first reference potential V1 | L | L | H | H | L | OFF | H | ON | OFF | OFF | 9 |
| | | NG | L | H | H | L | OFF | H | ON | OFF | OFF | 10 |
| | | L | NG | H | H | L | OFF | H | ON | OFF | OFF | 11 |
| | | L | L | NG | H | L | OFF | H | ON | OFF | OFF | 12 |
| | | L | L | H | NG | L | OFF | H | ON | OFF | OFF | 13 |
| | | L | L | H | H | L | NG | H | ON | OFF | OFF | 14 |
| | | L | L | H | H | L | OFF | H | NG | OFF | OFF | 15 |
| | | L | L | H | H | L | OFF | H | ON | NG | OFF | 16 |
| short | Lower than second reference potential V2 | H | H | L | L | L | OFF | H | ON | OFF | OFF | 17 |
| | | NG | H | L | L | L | OFF | H | ON | OFF | OFF | 18 |
| | | H | NG | L | L | L | OFF | H | ON | OFF | OFF | 19 |
| | | H | H | NG | L | L | OFF | H | ON | OFF | OFF | 20 |
| | | H | H | L | NG | L | OFF | H | ON | OFF | OFF | 21 |
| | | H | H | L | L | L | NG | H | ON | OFF | OFF | 22 |
| | | H | H | L | L | L | OFF | H | NG | OFF | OFF | 23 |
| | | H | H | L | L | L | OFF | H | ON | NG | OFF | 24 |

LIGHT EMITTING MODULE

CROSS-REFERENCE TO RELATED PATENT APPLICATION

The present application claims priority under 35 U.S.C. § 119 to Japanese Patent Application No. 2021-010873, filed on Jan. 27, 2021. The contents of this application are incorporated herein by reference in their entirety.

BACKGROUND OF THE INVENTION

Field of the Invention

The present disclosure relates to a light-emitting module.

Discussion of the Background

In recent years, light-emitting modules equipped with laser diodes (LD) have been developed for lighting devices and vehicular head lamps. In such light-emitting modules, a laser light emitted from an LD is irradiated to the converting member, the wavelength of the laser light is converted by the converting member, and is emitted to the outside as a light suitable for lighting. Laser light has relatively high coherence, but by passing through the converting member, light with lower coherence than that of the laser light is emitted to the outside.

In such light emitting modules, if the converting member is damaged due to an external impact, laser light may leak to the outside of the light-emitting module and may enter the human eye. For this reason, there has been proposed a stop system that is configured to stop lasing of the LD when the converting member is damaged (for example, see JP 2013-191479A). When the converting member is damaged, reliable termination of the lasing is required in such a stopping system.

SUMMARY OF THE INVENTION

The embodiments of the present invention are devised in the light of such circumstances, and it is hence advantageously provide a light-emitting module in which lasing can be reliably terminated when the converting member is damaged.

A light-emitting module according to one embodiment of the present disclosure comprises: a laser element configured to emit a laser light; a converting member configured to reduce coherence of the laser light; a sense wiring being electrically connected to the converting member; an electric potential determining circuit configured to output a first value when an electric potential at the first end of the sense wiring is in a predetermined range, and to output a second value when the electric potential at the first end of the sense wiring is out of the predetermined range; a first switching element electrically connected in series to the laser element, the first switching element being configured to become conductive when the output of the electric potential determining circuit is the first value, and to become non-conductive when the output of the electric potential determining circuit is the second value; and a second switching element electrically connected in parallel to a circuit comprising the laser element and the first switching element, the second switching element being configured to become conductive when the output of the electric potential determining circuit is the second value, and to become non-conductive when the output of the electric potential determining circuit is the first value.

A light-emitting module according to another embodiment of the present disclosure, the light-emitting module includes: a laser element configured to emit a laser light; a converting member configured to reduce coherence of the laser light; a sense wiring electrically connected to the converting member; an electric potential determining circuit being configured to output a first value when an electric potential at the first end of the sense wiring is in a predetermined range, and to output a second value when the electric potential at the first end of the sense wiring is out of the predetermined range; and a first switching element electrically connected in series to the laser element, the first switching element being configured to become conductive when the output of the electric potential determining circuit is the first value, and to become non-conductive when the output of the electric potential determining circuit is the second value. The electric potential determining circuit includes: a first comparator being configured to output the first value when the electric potential at the first end of the sense wiring is lower than a first reference potential, and to output a second value when the electric potential at the first end of the sense wiring is higher than the first reference potential; a second comparator being configured to output the first value when the electric potential at the first end of the sense wiring is lower than the first reference potential, and to output the second value when the electric potential at the first end of the sense wiring is higher than the first reference potential; a third comparator being configured to output the first value when the electric potential at the first end of the sense wiring is higher than a second reference potential that is lower than the first reference potential, and to output the second value when the electric potential at the first end of the sense wiring is lower than the second reference potential; and a fourth comparator being configured to output the first value when the electric potential at the first end of the sense wiring is higher than the second reference potential, and to output the second value when the electric potential at the first end of the sense wiring is lower than the second reference potential.

According to the embodiments of the present disclosure, a light-emitting module is provided that can reliably stop laser light in the event of damage to the converting member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a chart illustrating operation of a light-emitting module according to one embodiment.

DETAILED DESCRIPTION OF EMBODIMENTS

Structure

Figure 1:
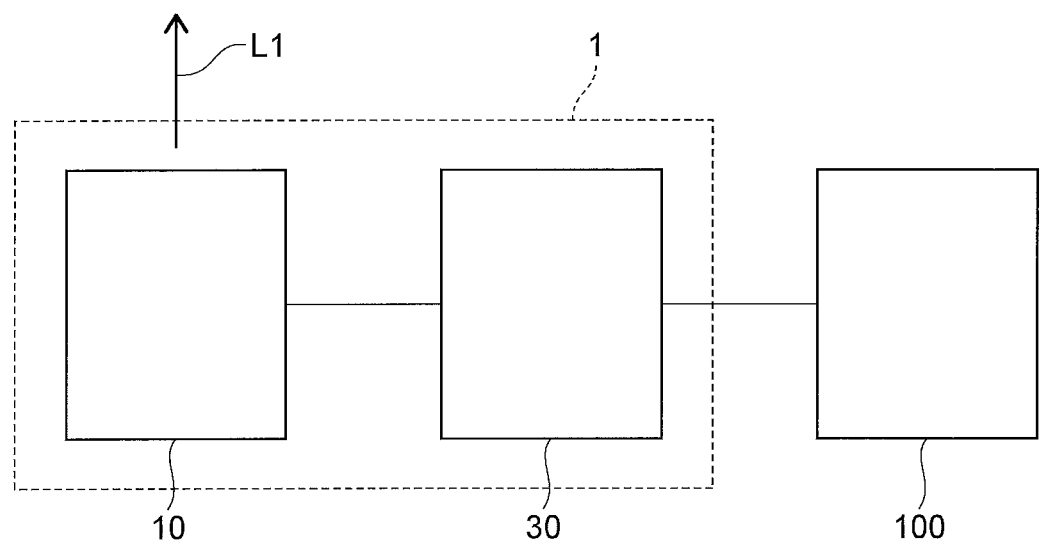
FIG. 1 is a block diagram of a light-emitting module according to one embodiment.
Figure 2:
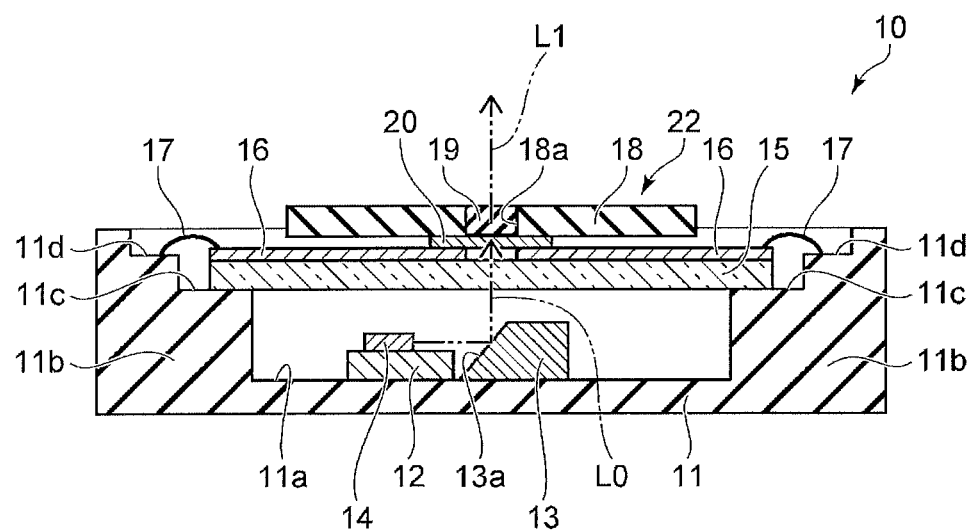
FIG. 2 is a schematic cross-sectional view showing a light-emitting part of a light-emitting module according to one embodiment.
Figure 3:
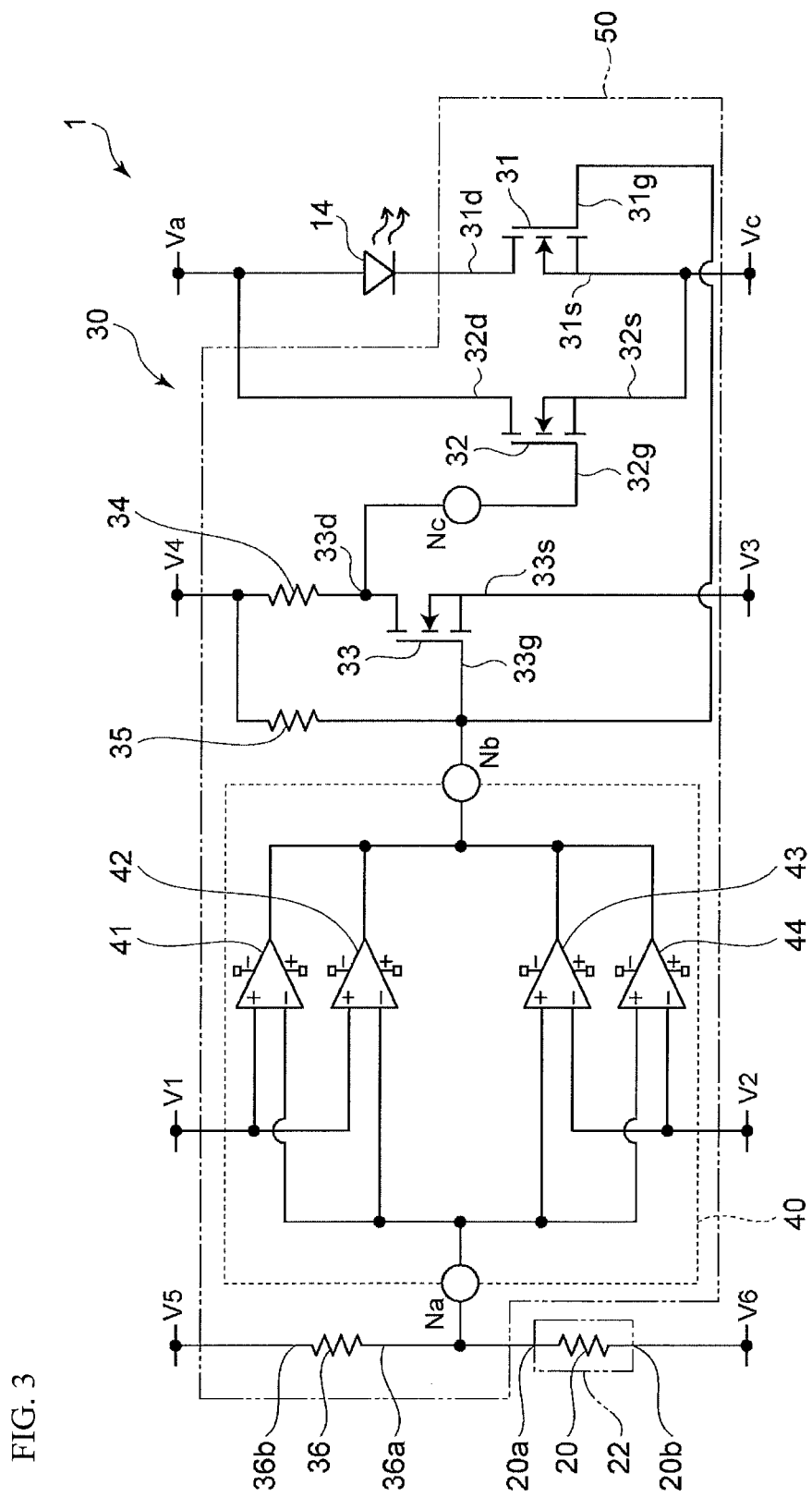
FIG. 3 is a circuit diagram of a light-emitting module according to one embodiment.

Next, one embodiment of the present disclosure will be described. FIG. 1 is a block diagram of a light-emitting module according to the present embodiment. FIG. 2 is a schematic cross-sectional view showing a light-emitting part of a light-emitting module according to the present embodiment. FIG. 3 is a circuit diagram showing a configuration of a light-emitting module according to the present embodiment.

As shown in FIG. 1, the light-emitting module 1 according to the present embodiment includes a light-emitting part 10 and a power supply part 30. The power supply part 30 is electrically connected to an external power source 100 to supply electric power to the light-emitting part 10. The light-emitting part 10 is caused to emit light L1 when the power is supplied from the power supply part 30.

Light-Emitting Part 10

As shown in FIG. 2, the light-emitting part 10 includes a casing 11. The casing 11 has a box-shape with an opening in an upper surface. For illustration purposes, the top surface in FIG. 2 is referred to as the upper surface, but a different direction may be indicated as the up/down direction in the light-emitting module 1. The casing 11 is made of an electrically insulating material. The casing 11 can be formed of ceramics materials as its main component and, for example, can contain aluminum nitride, silicon nitride, aluminum oxide or silicon carbide.

A sub-mount 12 and a light-reflecting member 13 are disposed in the casing 11. The sub-mount 12 and the light-reflecting member 13 are secured to the bottom surface 11a in the casing 11. The sub-mount 12 is, for example, a block of a substantially rectangular parallelepiped shape with ceramic or metal materials as its main material. A laser element 14 is disposed on the sub-mount 12. That is, the laser element 14 is arranged in the casing 11. The light laser element 14 is, for example, a laser diode (LD) containing a group III nitride-based semiconductor having the laser element. The laser element 14 is configured to emit laser light L0. The laser light L0 is blue, for example. At least one laser element 14 is employed. A plurality of laser elements 14 may be employed. A plurality of laser elements 14 can be electrically connected in series or a in parallel.

The light-reflecting member 13 includes, for example, a block formed of glass or semiconductor, and a light-reflecting film disposed on the surfaces of the block. When the block is formed of a light-reflecting material such as a metal material, it is not necessary to have a light reflectance film. The light-reflecting member 13 has a light-reflecting surface 13a. The light-reflecting surface 13a faces the laser element 14 and is tilted against the bottom surface 11a in the casing 11. If the light-reflecting member 13 has a light-reflecting film, the surface on which the light-reflecting film is disposed is the light-reflecting surface 13a.

The upper inner surfaces of the lateral wall 11b of the casing 11 have step structures 11c and 11d. The step structures 11c and 11d have a frame shape along the outer edge of the casing 11 in a top view. The step structure 11d is located at an upper and outer side with respect to the step structure 11c.

A light-transmissive member 15 is disposed on the step structure 11c that is located at a lower and inner side than the step structure 11d. The light-transmissive member 15 is a plate-shaped member that transmits the laser light L0 therethrough, and formed of, for example, sapphire or glass. The outer peripheral portion of the light-transmissive member 15 is secured to the step structure 11c. With this arrangement, the light-transmissive member 15 hermetically seals the opening of the casing 11.

A wiring pattern 16 is disposed on the upper surface of the light-transmissive member 15. The wiring pattern 16 is disposed on the upper surface of the light-transmissive member 15 by, for example, sputtering. A pair of wirings 17 are connected to corresponding portions of the wiring pattern 16, respectively. The pair of wirings 17 are electrically connected to a power supply part 30 through corresponding conductive members disposed within a body of the casing 11. A converting member 22 is disposed above the light-transmissive member 15 and the wiring pattern 16. The converting member 22 includes a support 18 and a coherence reduction part 19. The support 18 is, for example, formed of ceramic material and has a plate-like shape with a through-opening 18a.

The coherence reduction part 19 is engaged in the through-opening 18a of the support 18. The support 18 supports the coherence reduction part 19. The coherence reduction part 19 is located where the laser light L0, which is emitted from the laser element 14 and is reflected at the light-reflecting surface 13a of the light-reflecting member 13 and is then transmitted through the light-transmissive member 15, enters. In other words, the coherence reduction part 19 is located in the optical path of the laser light L0. The coherence reduction part 19 is, for example, formed of ceramics. In the coherence reduction part 19, for example, a fluorescent material is contained in a base material formed of a light-transmissive inorganic material. The inorganic light-transmissive material is, for example, aluminum oxide.

The laser light L0 emitted from the laser element 14 is guided to enter the coherence reduction part 19, where the coherence of the laser light L0 is reduced. For example, the coherent reduction part 19 contains a fluorescent material configured to convert the laser light L0 to light of a different wavelength. In other words, a member containing a fluorescent material is used as the coherence reduction part 19, for example. The fluorescent material contained in the coherence reduction part 19 absorbs, for example, the blue laser light L0 and emits yellow light. As a result, blue light, which is diffused laser light L0, and yellow light emitted from the fluorescent material, are emitted from the coherence reduction part 19, such that collective white light L1 is emitted from the coherence reduction part 19. The coherence reduction part 19 containing a fluorescent material allows for a reduction of coherence of the laser light L0, which allows emission of light L1 having lower coherence than that of the laser light L0. Alternatively, a light diffusing member such as a light-diffusing plate may be used as the coherence reduction part 19. In this case, the coherence reduction part 19 does not have to contain a fluorescent material.

Examples of the fluorescent material contained in the coherence reduction part 19 include a yttrium aluminum garnet (YAG) fluorescent material activated with cerium, a lutetium aluminum garnet (LAG) fluorescent material activated with cerium, a nitrogen-containing calcium aluminosilicate ($CaO—Al_2O_3—SiO_2$) fluorescent material activated with europium and/or chromium, a silicate fluorescent material (($Sr,Ba)_2SiO_4$) activated with europium, an α-sialon fluorescent material, and a β-sialon fluorescent material. Among those, it is preferable to use a YAG fluorescent material, which has good heat resistance.

A sense wiring 20 is electrically connected to the converting member 22. The sense wiring 20 is secured, for example, to a lower surface of the converting member 22, that is, to a surface that faces toward the light-transmissive member 15. Other than the lower surface of the converting member 22, the position of the sense wiring 20 can be appropriately determined. For example, the sense wiring 20 can be disposed on an upper surface of the converting member 22. The sense wiring 20 can also be electrically connected to both the support 18 and the coherence reduction part 19 of the converting member 22, or to only one of them. When the sense wiring 20 is electrically connected only to the support 18, a reduction in the extraction efficiency of the light caused by absorption of light by the sense wiring 20 can be suppressed.

The sense wiring 20 is formed of an electrically conductive material. The sense wiring 20 is formed of, for example, a material that is light-transmissive and electrically conductive. The sense wiring 20 is formed of, for example, indium tin oxide (ITO). The sense wiring 20 can include a metal material. The sense wiring 20 is electrically connected to a wiring pattern 16. Accordingly, the sense wiring 20 is electrically connected to the power supply part 30 through the wiring pattern 16 and the wirings 17. The converting member 22 and the sense wiring 20 can be located spaced apart from the casing 11 and a lid (for example the light-transmissive member 15) which encapsulate the laser element 14. In this case, the wiring pattern 16 and the wirings 17 are optional, and the sense wiring 20 is electrically connected to the power supply part 30 through the wirings that is disposed spaced apart from the casing 11, for example.

Power Supply Part 30

As shown in FIG. 3, the power supply part 30 includes a wiring substrate 50 on which a first switching element 31, a second switching element 32, a third switching element (first transistor 33), a first resistance element 34, a second resistance element 35, a third resistance element 36, a first comparator 41, a second comparator 42, a third comparator 43, and a fourth comparator 44 are mounted. The first comparator 41, the second comparator 42, the third comparator 43, and the fourth comparator 44 constitute an electric potential determining circuit 40. The wiring substrate 50 and the light-emitting part 10 can be electrically connected by, for example, wirings with connectors. Alternatively, the power supply part 30 and the light-emitting part 10 may be secured to a single board.

Through an external power source 100, a first reference potential V1, a second reference potential V2, a third reference potential V3, a fourth reference potential V4, a fifth reference potential V5, a sixth reference potential V6, an anode potential Va, and a cathode potential Vc are supplied to the power supply part 30. The third reference potential V3 and the sixth reference potential V6 may be supplied through the same wire. The fourth reference potential V4 and the fifth reference potential V5 may be supplied via the same wire. It is not necessary that all reference potentials are supplied from the external power source 100. For example, the first reference potential V1 and the second reference potential V2 can be supplied from a circuit mounted on the wiring substrate 50.

The first reference potential V1 is lower than the fifth reference potential V5 and higher than the second reference potential V2. The second reference potential V2 is lower than the first reference potential V1 and higher than the sixth reference potential V6. In other words, the reference potentials are in a descending order of V5>V1>V2>V6.

In one example, the fifth reference potential V5 is 5V (supply potential), and the first reference potential V1 is in a range of 3 to 4.5V, the second reference potential V2 is in a range of 0.5 to 2V, and the sixth reference potential V6 is 0V (ground potential). The third reference potential V3 is 0V (ground potential) and the fourth reference potential V4 is 5V (power source potential). In one example, the anode potential Va is in a range of 5 to 24 V, and the cathode potential Vc is in a range of 0 to 10 V and is lower than the anode potential Va.

A first end 20a of the sense wiring 20 is electrically connected to a first node Na and a first end 36a of the third resistance element 36, and a second end 20b of the sense wiring 20 is electrically connected to the sixth reference potential V6. The second end 36b of the third resistance element 36 is electrically connected to the fifth reference potential V5. Accordingly, the third resistance element 36 and the sense wiring 20 are connected in series between the fifth reference potential V5 and the sixth reference potential V6.

The first comparator 41, the second comparator 42, the third comparator 43, and the fourth comparator 44 (hereinafter collectively referred to as "comparators") constitute an electric potential determining circuit 40. Each of the comparators has two input terminals and one output terminal, so as to compare potentials at the two input terminals and outputs a potential corresponding to the comparison result. Each of the comparators is supplied with a high potential side reference potential and a low potential side reference potential. The high potential side reference potential is, for example, 5V (supply potential) and the low potential side reference potential is, for example, 0V (ground potential), but other appropriate potential values can be employed. The high potential side reference potentials of the four comparators shown in FIG. 3 can all be the same potential, and the low potential side reference potentials of the four comparators shown in FIG. 3 can all be the same potential.

The first input terminal of the first comparator 41 is connected to the first reference potential V1, and the second input terminal is connected to the first end 20a (first node Na) of the sense wiring 20. The first comparator 41 outputs a first value (H) when the potential at the first end 20a of the sense wiring 20 is lower than the first reference potential V1, and outputs a second value (L) when the potential at the first end 20a is higher than the first reference potential V1. For example, the first value (H) is the potential that sets the switching elements and the transistors that constitutes the power supply part 30 to a conductive state (ON state), and the second value (L) is the potential that sets these switching elements and the transistors to a non-conductive state (OFF state). For example, when the low potential side reference potential of the first comparator 41 is 0 V (ground potential), the second value (L) will be 0 V.

Similarly for the second comparator 42, the first input terminal is connected to the first reference potential V1, and the second input terminal is electrically connected to the first end 20a (first node Na) of the sense wiring 20. The second comparator 42 outputs a first value (H) when the potential at the first end 20a of the sense wiring 20 is lower than the first reference potential V1, and a second value (L) when the potential at the first end 20a is higher than the first reference potential V1. In other words, the second comparator 42 executes the same operation as the first comparator 41.

The first input terminal of the third comparator 43 is electrically connected to the first end 20a (first node Na) of the sense wiring 20, and the second input terminal is electrically connected to the second reference potential V2. The third comparator 43 outputs a first value (H) when the potential of the first end 20a of the sense wiring 20 is higher than the second reference potential V2, and a second value (L) when the potential of the first end 20a is lower than the second reference potential V2.

Similarly for the fourth comparator 44, the first input terminal is electrically connected to the first end 20a (first node Na) of the sense wiring 20, and the second input terminal is electrically connected to the second reference potential V2. The fourth comparator 44 outputs a first value (H) when the potential of the first end 20a of the sense wiring 20 is higher than the second reference potential V2, and the second value (L) when the potential of the first end 20a is lower than the second reference potential V2. In other words, the fourth comparator 44 executes the same operation as the third comparator 43.

The output terminal of the first comparator 41, the output terminal of the second comparator 42, the output terminal of the third comparator 43, and the output terminal of the fourth comparator 44 are electrically connected to the second node Nb. The second node Nb is the output point for the electric potential determining circuit 40. When all the outputs of all the comparators are all at the first value (H), the potential of the second node Nb is at the first value (H). On the other hand, when the output of one of the comparators is a second value (L), the potential of the second node Nb is drawn to the low potential side reference potential, resulting in a second value (L).

Accordingly, the electric potential determining circuit 40 outputs a first value (H) when the potential at the first end 20a (first node Na) of the sense wiring 20 is in a predetermined range, that is, in a range that is higher than the second reference potential V2 and lower than the first reference potential V1. In the description below, the range of the potential that is higher than the second reference potential V2 and lower than the first reference potential V1 will be referred to as "normal range". On the other hand, the electric potential determining circuit 40 outputs a second value (L) when the potential at the first end 20a (first node Na) of the sense wiring 20 is outside of the normal range, that is, lower than the second reference potential V2 or higher than the first reference potential V1.

A second resistance element 35 is electrically connected between the second node Nb and the fourth reference potential V4 (for example, the power potential). The first resistance element 34 and the third switching element (first transistor 33) are connected in series between the circuit that applies the fourth reference potential V4 and the circuit that applies the third reference potential V3 (for example, ground potential). Although the third switching element is not limited to a transistor, the use of the first transistor 33 as the third switching element can increase the switching speed. The first transistor 33 is, for example, an n-channel type field-effect transistor (FET). The first transistor 33 is, for example, an n-channel type metal-oxide-semiconductor field-effect transistor (MOSFET). The first transistor 33 includes a third gate 33g, a third source 33s, and a third drain 33d. The first transistor 33 is in a conducting state when the first value (H) is inputted in the third gate 33g, and in a non-conducting state when the second value (L) is inputted. In other words, the threshold voltage at which the third gate 33g is switched on is between the first value (H) and the second value (L).

The third gate 33g of the first transistor 33 is electrically connected to the output point of the second node Nb, that is, the electric potential determining circuit 40, and the third source 33s is electrically connected to the third reference potential V3 (for example: ground potential). The third drain 33d is electrically connected to the first end of the first resistance element 34. The second end of the first resistance element 34 is electrically connected to the fourth reference potential V4 (for example, the power source potential).

In FIG. 3, a transistor (second transistor) is used as the second switching element 32. The second switching element 32 is, for example, an n-channel type FET. The second switching element 32 is, for example, an n-channel type MOSFET. The second switching element 32 includes a second gate 32g, a second source 32s, and a second drain 32d. The second gate 32g is electrically connected to the third node Nc, which is the connection point of the first transistor 33 and the first resistance element 34. The second source 32s is electrically connected to the cathodic potential Vc. The second drain 32d is electrically connected to the anode potential Va. The resistance of the first resistance element 34 is lower than the resistance between the second gate 32g of the second switching element 32 and the second source 32s. Although the second switching element 32 is not limited to a transistor, it is preferable to use a transistor as the second switching element 32 because transistors are suitable for carrying relatively large currents.

The electric potential at the connection point of the first resistance element 34 and the first transistor 33, that is, the electric potential at the third node Nc, is substantially equal to the third reference potential V3 when the first transistor 33 is in the conducting state. Accordingly, the third reference potential V3 is set to a value lower than the threshold value at which the second switching element 32 becomes conductive. With this arrangement, when the first transistor 33 is in the conducting state, the second switching element 32 does not conduct electrically. When the second value "L" and the third reference potential V3 are equal potentials (for example, ground potential), the potential of the third node Nc when the first transistor 33 is in the conductive state is approximately equal to the second value "L".

On the other hand, when the first transistor 33 is in a non-conductive state, the potential of the third node Nc is drawn to the fourth reference potential V4 (for example, the power source potential), resulting in a higher potential than when the first transistor 33 is in a conductive state. The fourth reference potential V4 is set such that the potential of the third node Nc when the first transistor 33 is in a non-conductive state is higher than the threshold for the second switching element 32 to be in a conductive state. The potential of the third node Nc when the first transistor 33 is in a non-conductive state is, for example, equal to the first value "H". Therefore, when the first transistor 33 is in a non-conductive state, the second switching element 32 is in a conductive state. Thus, the second switching element 32 is in a conductive state when the output of the electric potential determining circuit 40, that is, the potential of the second node Nb is at the second value (L), and is in a non-conductive state when the output of the electric potential determining circuit 40 is at the first value (H).

In FIG. 3, a transistor (third transistor) is used as the first switching element 31. The first switching element 31 is, for example, is an n-channel type FET. The first switching element 31 is a transistor having a same conductivity type as that of the second switching element 32 and the first transistor 33, for example, an n-channel MOSFET. The first switching element 31 includes a first gate 31g, a first source 31s, and a first drain 31d. The first gate 31g is connected to the second node Nb, i.e. the output point of the electric potential determining circuit 40. Accordingly, the first switching element 31 switches between a conductive state and a non-conductive state depending on the potential of the second node Nb, i.e. the output point of the electric potential determining circuit 40. The first switching element 31 is in a conductive state when the potential at the output point of the electric potential determining circuit 40 is at the first value (H) and not at the second value (L). Other than transistors, any suitable element that can perform such an operation can be employed for the first switching element 31, but it is preferable to use a transistor as the first switching element 31 because the transistor is suitable for earning relatively large current.

The first drain 31d of the first switching element 31 is connected to the cathode of laser element 14. The first source 31s is connected to a circuit that applies a cathodic potential Vc. The anode of laser element 14 is connected to a circuit that applies an anode potential Va. With this arrangement, the laser element 14 and the first switching element 31 are connected in series between the circuits that apply anode potential Va and cathode potential Vc. The second switching element 32 is connected in parallel to the circuit that includes the laser element 14 and the first switching element 31, and between the circuits that apply anode potential Va and cathode potential Vc.

The current that flows to the laser element 14 can flow to the first switching element 31 and the second switching element 32. On the other hand, the current that flows to the laser element 14 does not flow to the first transistor 33. For this reason, a rated value of the drain current of the first transistor 33 can be lower than a rated value of the first switching element 31 and a rated value of the second switching element 32. The rated value of the drain current of the first transistor 33 can be equal to or less than 10% or equal to or less than 1% of the nominal value of the first switching element 31 and of the nominal value of the second switching element 32. For example, the rated values of the drain current of the first switching element 31 and the second switching element 32 are in a range of several tens to several hundreds of amperes (A), and the rated value of the drain current of the first transistor 33 can be less than 1 A. Reducing the rated value of the first transistor 33 allows for a reduction in the size and cost of the light-emitting module 1.

Operation

Next, operation of the light-emitting module according to the present embodiment will be described. FIG. 4 is a chart illustrating operation of a light-emitting module according to the present embodiment. In the present embodiment, the term "normal mode" indicates that the sense wiring 20 is in a normal state, the term "open mode" indicates that an open failure occurs in the sensing wiring 20, and the term "short circuit mode" indicate that a short circuit occurs in the sense wiring 20.

When the light emitting module 1 is normal, the sensing wiring 20 is also normal, and the light-emitting module 1 is in "normal mode". In the normal mode, it is required that laser element 14 emits light when power is supplied to light-emitting module 1, that is, lasing occurs in the laser element 14 and a laser light L0 is emitted from the laser element 14.

On the other hand, for example, when the converting member 22 is damaged and disconnects the sense wiring 20, it is in an "open mode". In the open mode, in order to prevent the laser light L0 from leaking to the outside of the casing 11, termination of laser oscillation of the laser element 14 is demanded. In the present specification, "termination of lasing" refers to stop the lasing of the laser element 14 so that the laser light L0 is not emitted. For example, a state in which an electric current below the threshold of lasing is presence in the laser element 14 is included in "termination of lasing".

Also, for example, when short circuit of the sense wiring 20 occurs due to a foreign material attaching on the sense wiring 20, it is in a "short circuit mode". Also, when a foreign material is attached to the conductive path that is electrically connected to sense wiring 20 and not to the sense wiring 20 and causes a substantially the same short circuit as short circuit of the sense wiring 20, it is also included in "short circuit mode". In the short circuit mode, even when the converting member 22 is damaged and disconnection of the sense wiring 20 occurs, continuity of the sense wiring 20 may be maintained by a foreign object, and it is possible that the damage of the converting member 22 cannot be detected. For this reason, even in the short circuit mode, termination of lasing of the laser element 14 is required.

In FIG. 4, when the potential at the output terminal of each of the comparators or the potential at each of the nodes is at the first value, it is denoted as "H" and when it is at the second value, it is denoted as "L". The two types of potentials that the third node Nc would take may not necessarily match the first and second values, but FIG. 4 shows an example where they match. When a comparator, a switching element or a transistor fails in an open state, it is denoted as "NG". When a switching element or a transistor is in continuity, it is denoted as "ON", while when a switching element or a transistor is not in continuity, it is denoted as "OFF". When the laser element 14 is emitting light, it is denoted as "ON" and when the laser element 14 is not emitting light, it is denoted as "OFF". In FIG. 4, the row numbers are included for the convenience of explanation. Next, the operation of the light-emitting module 1 in each mode will be described.

Normal Mode

First, an operation in a normal mode will be described. As illustrated above, in a normal mode, the converting member 22 is normal, and the sense wiring 20 is also normal.

With reference to the first row of FIG. 4, each circuit element in power supply part 30 is also normal. In the present specification, the term "circuit element" refers collectively to each comparator, the first switching element 31, the second switching element 32, and the first transistor 33.

As shown in FIG. 1, when the light-emitting module 1 is electrically connected to an external power source 100, a predetermined potential is applied to each part of the light-emitting module 1. More specifically, a fifth reference potential V5 (for example, power source potential) and a sixth reference potential V6 (for example, ground potential) are applied to both ends of the circuit to which the third resistance element 36 and the sense wiring 20 are connected in series. In addition, the first reference potential V1 and the second reference potential V2 are applied to the electric potential determining circuit 40. The second reference potential V2 is lower than the first reference potential V1. The fourth reference potential V4 (for example, power source potential) and the third reference potential V3 (for example, ground potential) are applied to both ends of the circuit where the first resistance element 34 and the first transistor 33 are connected in series. Further, anode potential Va and cathode potential Vc are applied to both ends of the circuit where the laser element 14 and the first switching element 31 are connected in series.

The potential difference between the fifth reference potential V5 and the sixth reference potential V6 is divided by the third resistance element 36 and the sense wiring 20. This results in the potential of the first node Na being within the range (normal range) which is higher than the second reference potential V2 and lower than the first reference potential V1.

The first comparator 41 compares the first reference potential V1 with the potential at the first node Na. In the state shown in the first row of FIG. 4, the first comparator 41 outputs the first value (H) because the potential at the first node Na, that is, the potential at the first end 20a of the sense wiring 20 is lower than the first reference potential V1. The second comparator 42 also compares the first reference potential V1 and the potential of the first node Na with outputs the first value (H) because the potential of the first node Na is lower than the first reference potential V1.

The third comparator 43 compares the potential of the first node Na with the second reference potential V2. Because the potential of the first node Na is higher than the second reference potential V2, the third comparator 43 outputs the first value (H). Similarly, the fourth comparator 44 compares the potential of the first node Na with the second reference potential V2 and outputs the first value (H) because the potential of the first node Na is higher than the second reference potential V2. Thus, because all the comparators output the first value (H), the potential of the output point of the electric potential determining circuit 40, i.e. the potential at the second node Nb is the first value (H).

This causes the first value (H) to be applied to the first gate 31g of the first switching element 31, turns the first switching element 31 in continuity. Meanwhile, the first value (H) is also applied to the third gate 33g of the first transistor 33, turns the first transistor 33 in continuity. Accordingly, the potential of the third node Nc is drawn to the third reference potential V3 to the second value (L). This causes the second value (L) applied to the second gate 32g of the second switching element 32, which turns the second switching element 32 in a non-conductive state.

As a result, current flows between the anode potential Va and the cathode potential Vc in the path that includes the first switching element 31, and substantially no current flows into the path that includes the second switching element 32. As a result, current flows to the laser element 14, causing lasing of the laser element 14, and a laser light L0 is emitted from the laser element 14.

As shown in FIG. 2, the laser light L0 emitted from the laser element 14 is reflected at the light-reflecting surface 13a of the light-reflecting member 13, which then passes through the light-transmissive member 15, and enters the coherence reduction part 19 of the converting member 22. Coherence of a portion of the laser light L0 incident on the coherence reduction part 19 decreases through the fluorescent material contained in the coherence reduction part 19, and for example, converted into a light having a different wavelength. For example, a blue laser light L0 is converted to a yellow light. The rest of the laser light L0 that enter the coherence reduction part 19 travels through the coherence reduction part 19 while being diffused within the coherence reduction part 19. As a result, white light L1, a mixture of yellow light and blue light, is emitted from the coherence reduction part 19.

Next, open states caused by failures of a part of the circuit elements that constitute the power supply part 30 will be described.

As shown in the second row of FIG. 4, when the first comparator 41 fails in an open state, the output terminal of the first comparator 41 enters an electrically floating state. Meanwhile, the second comparator 42 outputs the first value (H), and the third comparator 43 and the fourth comparator 44 also output the first value (H). Thus, the potential at the output point (second node Nb) of the electric potential determining circuit 40 remains at the first value (H). For this reason, the laser element 14 emits light, and light L1 is emitted from the light-emitting module 1, as similar to the operation shown in the first row of FIG. 4.

As shown in the third row of FIG. 4, when the second comparator 42 fails in an open state, the output terminal of the second comparator 42 enters an electrically floating state. Meanwhile, the first comparator 41 outputs the first value (H), and the third comparator 43 and the fourth comparator 44 also output the first value (H). Thus, the potential at the output point (second node Nb) of the electric potential determining circuit 40 remains at the first value (H). For this reason, the laser element 14 emits light, and light L1 is emitted from the light-emitting module 1, as similar to the operation shown in the first row of FIG. 4. Thus, in the normal mode, the first comparator 41 and the second comparator 42 are in a complementary relation.

As shown in the fourth row of FIG. 4, when the third comparator 43 fails in an open state, the output terminal of the third comparator 43 enters an electrically floating state. Meanwhile, the fourth comparator 44 outputs the first value (H), and the first comparator 41 and the second comparator 42 also output the first value (H). Thus, the potential at the output point (second node Nb) of the electric potential determining circuit 40 remains at the first value (H). For this reason, the laser element 14 emits light, and light L1 is emitted from the light-emitting module 1, as similar to the operation shown in the first row of FIG. 4.

As shown in the fifth row of FIG. 4, when the fourth comparator 44 fails in an open state, the output terminal of the fourth comparator 44 enters an electrically floating state. Meanwhile, the third comparator 43 outputs the first value (H), and the first comparator 41 and the second comparator 42 also output the first value (H). Thus, the potential at the output point (second node Nb) of the electric potential determining circuit 40 remains at the first value (H). For this reason, the laser element 14 emits light, and light L1 is emitted from the light-emitting module 1, as similar to the operation shown in the first row of FIG. 4. Thus, in normal mode, the third comparator 43 and the fourth comparator 44 are in a complementary relation.

As shown in the sixth row of FIG. 4, when the first transistor 33 fails in an open state, the third node Nc is electrically disconnected from the circuit that applies the third reference potential V3 (for example, ground potential). Thus, the potential of the third node Nc is drawn to the fourth reference potential V4 (for example, power source potential) to the first value (H). This provides continuity for the second switching element 32. Meanwhile, the potential of the second node Nb is the first value (H), accordingly, the first switching element 31 is also in continuity. However, in this case, sufficient current will not flow to the laser element 14 the lasing of the laser element 14 stops. For example, FETs are used as the first switching element 31 and the second switching element 32, and a laser diode that includes a group III nitride-based semiconductor is used as the laser element 14. In this case, when both the first switching element 31 and the second switching element 32 are in continuity, the current flow to laser element 14 can be less than the threshold for laser oscillation of the laser element 14.

As shown in the seventh row of FIG. 4, even when the second switching element 32 fails in an open state, the first switching element 31 maintains continuity, and laser element 14 emits light.

As shown in the eighth row of FIG. 4, when the first switching element 31 fails in an open state, current is no longer supplied to the laser element 14, and laser oscillation of the laser element 14 stops.

As illustrated above, in the normal mode, when the first transistor 33 fails (sixth row of FIG. 4) and when the first switching element 31 fails (eighth row of FIG. 4), the laser oscillation of the laser element 14 stops, but when a comparator or the second switching element fails, the laser oscillation of the laser element 14 continues. Therefore, the light-emitting module 1 can maintain its light-emitting state with high probability even when some of the circuit elements in the power supply part 30 fail.

Open Mode

Next, the operation in an open mode will be described. As described above, when the converting member 22 is damaged, the sense wiring 20 is disconnected and enters an open mode. In an open mode, termination of the lasing of the laser element 14 is required.

As shown in the ninth row of FIG. 4, if disconnection of the sense wiring 20 occurs when each circuit element in the power supply part 30 is normal, the potential at the first node Na is drawn to the fifth reference potential V5 (for example, power source potential) and becomes higher than the first reference potential V1. As a result, the output of the first comparator 41 and the output of the second comparator 42 become the second value (L) and the potential at the output point (second node Nb) of the electric potential determining circuit 40 becomes the second value (L). The output of the third comparator 43 and the output of the fourth comparator 44 remain at the first value (H).

As a result, the potential at the first gate 31g of the first switching element 31 also becomes the second value (L), and the first switching element 31 becomes non-conductive. Meanwhile, the potential at the third gate 33g of the first transistor 33 also becomes the second value (L), and the first transistor 33 also enters a non-conductive state. This causes the potential of the third node Nc drawn to the fourth reference potential V4 to become the first value (H), and the potential at the second gate 32g of the second switching element 32 also becomes the first value (H). Therefore, the second switching element 32 is in a conductive state.

As a result, current flows between the anode potential Va and the cathode potential Vc in the path containing the second switching element 32, and no current flows to the path containing the first switching element 31. This prevents current from flowing to the laser element 14 and stops the laser oscillation. Therefore, light L1 is not emitted from the light-emitting module 1.

As shown in the tenth row of FIG. 4, when the first comparator 41 fails in an open state, the output terminal of the first comparator 41 enters in an electrically floating state. However, because the second comparator 42 outputs a second value (L), the potential at the output point (second node Nb) of the electric potential determining circuit 40 remains at the electric potential determining circuit remains at the second value (L). As a result, the laser element 14 does not emit light, as does the operation shown in the 9th row of FIG. 4. Therefore, light L1 is not emitted from the light-emitting module 1.

As shown in the 11th row of FIG. 4, if the second comparator 42 fails in an open state, the output terminal of the second comparator 42 enters in an electrically floating state. However, because the first comparator 41 outputs a second value (L), the potential at the output point (second node Nb) of the electric potential determining circuit 40 remains at the second value (L). As a result, the laser element 14 does not emit light, as does the operation shown in the 9th row of FIG. 4. Therefore, light L1 is not emitted from the light-emitting module 1. Thus, in an open mode, the first comparator 41 and the second comparator 42 complement with each other.

As shown in the 12th row of FIG. 4, even when the third comparator 43 fails in an open state, the first comparator 41 and the second comparator 42 output a second value (L), such that the potential at the output point (second node Nb) of the electric potential determining circuit 40 remains at the second value (L). As a result, the laser element 14 does not emit light, as does the operation shown in the 9th row of FIG. 4. Therefore, light L1 is not emitted from the light-emitting module 1.

As shown in the 13th row of FIG. 4, even when the fourth comparator 44 fails in an open state, the first comparator 41 and the second comparator 42 output a second value (L), such that the potential at the output point (second node Nb) of the electric potential determining circuit 40 remains at the second value (L). As a result, the laser element 14 does not emit light, as does the operation shown in the 9th row of FIG. 4. Therefore, light L1 is not emitted from the light-emitting module 1.

As shown in the 14th row of FIG. 4, even when the first transistor 33 fails in an open state, it is equivalent in operation to the first transistor 33 being in a non-conductive state, and thus, the laser element 14 does not emit light as the operation shown in the 9th row of FIG. 4. Therefore, light L1 is not emitted from the light-emitting module 1.

As shown in the 15th row of FIG. 4, when the second switching element 32 fails in an open state, electric current does not flow to the path containing the second switching element 32. However, because the potential at the second node Nb is the second value (L), the potential at the first gate 31g of the first switching element 31 is also the second value (L), and thus the first switching element 31 is not in continuity. Therefore, the laser element 14 does not emit light, and light L1 is not emitted from the light-emitting module 1.

As shown in the 16th row of FIG. 4, even when the first switching element 32 fails and becomes open, it is equivalent in operation to the first switching element 31 being in a non-conductive state, and thus, the laser element 14 does not emit light. Therefore, light L1 is not emitted from the light-emitting module 1. Meanwhile, the second switching element 32 is in a conductive state, current flows between the anode potential Va and the cathode potential Vc to the path containing the second switching element 32.

As illustrated above, in an open mode, the laser element 14 remains in a state where the laser oscillation has stopped when any one of the circuit elements fails. Accordingly, when the converting member 22 is damaged and also any one of the circuit elements fails, leakage of laser light L0 to the outside of the light-emitting part 10 does not occur.

Short Circuit Mode

Next, the operation in a short circuit mode will be described. As described above, a short circuit mode failure may occur when substantial short circuit occurs due to, for example, a foreign matter attaching to the sense wiring 20. In a short circuit mode, the sense wiring 20 may not be able to detect damage of the converting member 22. Therefore, it is necessary to stop the laser oscillation of the laser element 14.

As shown in the 17th row of FIG. 4, when each circuit element of the power supply part 30 is in normal, when the sense wiring 20 is short circuited, the potential of the first node Na is drawn by the sixth reference potential V6 (for example, ground potential) and becomes lower than the second reference potential V2. As a result, the output of the third comparator 43 and the output of the fourth comparator 44 become the second value (L) and the potential at the output point (second node Nb) of the electric potential determining circuit 40 becomes the second value (L). Therefore, laser element 14 does not emit light, and light L1 is not emitted from the light-emitting module 1. The output of the first comparator 41 and the output of the second comparator 42 are the first value (H).

As shown in the 18th row of FIG. 4, even when the first comparator 41 fails in an open state, the third comparator 43 and the fourth comparator 44 output a second value (L), such that the potential at the output point (second node Nb) of the electric potential determining circuit 40 remains at the second value (L). Therefore, laser element 14 does not emit light, and light L1 is not emitted from the light-emitting module 1 as in the operation shown in the 17th row of FIG. 4.

As shown in the 19th row of FIG. 4, even when the second comparator 42 fails in an open state, the third comparator 43 and the fourth comparator 44 output a second value (L), such that the potential at the output point (second node Nb) of the electric potential determining circuit 40 remains at the second value (L). Therefore, laser element 14 does not emit light, and light L1 is not emitted from the light-emitting module 1 as in the operation shown in the 17th row of FIG. 4.

As shown in the 20th row of FIG. 4, when the third comparator 43 fails in an open state, the output terminal of the third comparator 43 enters an electrically floating state. However, because the fourth comparator 44 outputs a second value (L), the potential at the output point (second node Nb) of the electric potential determining circuit 40 remains at the second value (L). As a result, the laser element 14 does not emit light, as the operation shown in line 17th row of FIG. 4. Therefore, light L1 is not emitted from the light-emitting module 1.

As shown in the 21th row of FIG. 4, when an open state is caused by a failure of the fourth comparator 44, the output terminal of the fourth comparator 44 enters an electrically floating state. However, because the third comparator 43 outputs a second value (L), the potential at the output point (second node Nb) of the electric potential determining circuit 40 remains at the second value (L). As a result, the laser element 14 does not emit light, as the operation shown in the 17th row of FIG. 4. Therefore, light L1 is not emitted from the light-emitting module 1. Thus, in a short circuit mode, the third comparator 43 and the fourth comparator 44 complement with each other.

As shown in the 22th row of FIG. 4, even when the first transistor 33 fails and becomes open, it is equivalent in operation to the first transistor 33 being in a non-conductive state, and thus, the laser element 14 does not emit light as the operation shown in the 17th row of FIG. 4. Therefore, light L1 is not emitted from the light-emitting module 1.

As shown in the 23rd row of FIG. 4, when the second switching element 32 fails in an open state, electric current does not flow to the path containing the second switching element 32. However, because the potential at the second node Nb is the second value (L), the potential at the first gate 31g of the first switching element 31 is also the second value (L), and thus the first switching element 31 is not in continuity. Therefore, the laser element 14 does not emit light, and light L1 is not emitted from the light-emitting module 1.

As shown in the 24th row of FIG. 4, if the first switching element 31 fails in an open state, the laser element 14 does not emit light because it is equivalent to that of the first switching element 31 in the non-conductive state for circuit operation. Therefore, light L1 is not emitted from the light-emitting module 1. Meanwhile, the second switching element 32 is in a conductive state, current flows between the anode potential Va and the cathode potential Vc to the path containing the second switching element 32.

As illustrated above, in a short circuit mode, the laser element 14 remains in a state where the laser oscillation has stopped when any one of the circuit elements fails. Accordingly, in a short circuit mode, when the converting member 22 is damaged and also any one of the circuit elements fails, leakage of laser light L0 to the outside of the light-emitting part 10 does not occur.

Other Failure Modes

FIG. 4 illustrates failure of a comparator, a switching element or a transistor is in an open state, but the failure may be in a short circuit state. For example, these failure condition may be in an open state via a short circuit state.

When the first switching element 31 is in a failure condition with a short circuit and the failure of the sense wiring 20 is in open mode or short circuit mode, the corresponding comparator outputs a second value (L), but the first switching element 31 is in a short circuit state, and therefore does not enter a non-conductive state. However, the comparator outputs a second value (L), which causes the second switching element 32 to carry on. With this arrangement, the portion lasing at the laser elements 14 can be protected.

When the second switching element 32 is in a short-circuit fault condition, the laser oscillation of the laser element 14 is stopped, regardless of whether it is in normal mode, open mode or short circuit mode. If the first transistor 33 is in a short-circuit fault condition, the second switching element 32 enters a non-conductive state, and depending on whether the first switching element 31 is in a continuity state, whether to execute lasing of the laser element 14 is determined. A failure condition other than the open condition of a corresponding one of the comparators is assumed to output a second value (L) regardless of the input value, for example by a short circuit of a part of the comparator, but in this case the second node Nb will be the second value (L), so that regardless of the normal mode, open mode, or short circuit mode, the laser oscillation of the laser element 14 stops.

Effects

Next, effects of the present embodiment will be described. The light-emitting module 1 according to the present embodiment is configured such that in an open mode, the first comparator 41 and the second comparator 42 are complementary, such that even when one of the first comparator 41 and the second comparator 42 fails, the other can output the second value (L). Therefore, it is possible to maintain the potential of the second node Nb at the second value (L), thereby more reliably stopping the laser oscillation of the laser element 14.

Meanwhile, in a short circuit mode, the third comparator 43 and the fourth comparator 44 are complementary, such that even when one of the third comparator 43 and the fourth comparator 44 fails, the other can output the second value (L). Therefore, it is possible to maintain the potential of the second node Nb at the second value (L), thereby more reliably stopping the laser oscillation of the laser element 14.

Further, by having the second switching element 32, the light-emitting module 1 according to the present embodiment can stop laser oscillation of the laser element 14 even when the failure condition of the first switching element 31 is not in an open state but in a short circuit state. Accordingly, lasing of the laser element 14 can be more securely stopped.

As described above, according to the present embodiment, even if some circuit elements fail, the laser oscillation of the laser element 14 can be stopped more reliably in an open mode and in a short circuit mode, while maintaining light emission with a high probability in a normal mode. Accordingly, it is possible to realize a light-emitting module that can reliably stop laser light when the converting member is damaged.

For example, when the light-emitting module 1 in the present embodiment is used as a headlight for vehicles such as automobiles, and the light emitting module 1 is damaged due to a vehicle accident, and some of the power supply part 30 along with the converting member 22 is damaged, laser light L0 can be prevented from going out of the light emitting module 1. As a result, high safety can be realized.

Note that depending on the failure condition of a comparator, a switching element, or a transistor, laser oscillation of the laser element 14 may stop even though the sense wiring 20 is in normal mode, but in such a case, there is an advantage that the user of the light emitting module 1 can be notified of the failure before further failure occurs.

The embodiment described above is to exemplify a light emitting module for embodying the technical idea of the present invention, and the technical idea of the present invention is not limited thereto. For example, the present invention includes the addition, deletion or modification of some components in the embodiment described above.

The present invention can be used for, for example, lighting devices and vehicular head lamps.

What is claimed is:

1. A light-emitting module comprising:
   a laser element configured to emit a laser light;
   a converting member configured to reduce a coherence of the laser light;
   a sense wiring electrically connected to the converting member;
   an electric potential determining circuit configured to output a first value when an electric potential at a first end of the sense wiring is in a predetermined range, and to output a second value when the electric potential at the first end of the sense wiring is out of the predetermined range;
   a first switching element electrically connected in series to the laser element, the first switching element configured to become conductive when the output of the electric potential determining circuit is the first value, and to become non-conductive when the output of the electric potential determining circuit is the second value; and
   a second switching element electrically connected in parallel to a circuit comprising the laser element and the first switching element, the second switching element configured to become conductive when the output of the electric potential determining circuit is the second value, and to become non-conductive when the output of the electric potential determining circuit is the first value.

2. The light-emitting module according to claim 1, wherein
   the electric potential determining circuit comprises:
   a first comparator configured to output the first value when the electric potential at the first end of the sense wiring is lower than a first reference potential, and to output the second value when the electric potential at the first end of the sense wiring is higher than the first reference potential;
   a second comparator configured to output the first value when the electric potential at the first end of the sense wiring is lower than the first reference potential, and to output the second value when the electric potential at the first end of the sense wiring is higher than the first reference potential;
   a third comparator configured to output the first value when the electric potential at the first end of the sense wiring is higher than a second reference potential that is lower than the first reference potential, and to output the second value when the electric potential at the first end of the sense wiring is lower than the second reference potential; and
   a fourth comparator configured to output the first value when the electric potential at the first end of the sense wiring is higher than the second reference potential, and to output the second value when the electric potential at the first end of the sense wiring is lower than the second reference potential.

3. The light-emitting module according to claim 1, wherein the first switching element is a transistor comprising a first gate, a first source, and a first drain.

4. The light-emitting module according to claim 3, wherein the first gate of the first switching element is electrically connected to an output point of the electric potential determining circuit.

5. The light-emitting module according to claim 3, wherein the second switching element is a transistor comprising a second gate, a second source, and a second drain.

6. The light-emitting module according to claim 5, further comprising:
   a first transistor comprising a third gate, a third source, and a third drain, the third gate being electrically connected to an output point of the electric potential determining circuit, and the third source being electrically connected to a circuit that is configured to supply a third reference potential; and
   a first resistance element electrically connected between the third drain of the first transistor and a circuit that is configured to supply a fourth reference potential;
   wherein the second gate of the second switching element is electrically connected to a connection point of the first transistor and the first resistance element.

7. The light-emitting module according to claim 6, wherein the first transistor is a transistor having a same conductive type as conductivity types of the first switching element and the second switching element.

8. The light-emitting module according to claim 1, further comprising a second resistance element electrically connected between the first end of the sense wiring and a circuit that is configured to supply a fifth reference potential, wherein a second end of the sense wiring is electrically connected to a circuit that is configured to supply a sixth reference potential.

9. The light-emitting module according to claim 1, wherein the converting member contains a fluorescent material configured to convert the laser light to light having a wavelength that is different from a wavelength of the laser light.

10. The light-emitting module according to claim 1, further comprising a casing, wherein the laser element is arranged in the casing, and the converting member is arranged on an optical path of the laser light emitted from the laser element.

11. A light-emitting module comprising:
a laser element configured to emit a laser light;
a converting member configured to reduce coherence of the laser light;
a sense wiring electrically connected to the converting member;
an electric potential determining circuit configured to output a first value when an electric potential at a first end of the sense wiring is in a predetermined range, and to output a second value when the electric potential at the first end of the sense wiring is out of the predetermined range; and
a first switching element electrically connected in series to the laser element, the first switching element configured to become conductive when the output of the electric potential determining circuit is the first value, and to become non-conductive when the output of the electric potential determining circuit is the second value;
wherein the electric potential determining circuit comprises
a first comparator configured to output the first value when the electric potential at the first end of the sense wiring is lower than a first reference potential, and to output the second value when the electric potential at the first end of the sense wiring is higher than the first reference potential,
a second comparator configured to output the first value when the electric potential at the first end of the sense wiring is lower than the first reference potential, and to output the second value when the electric potential at the first end of the sense wiring is higher than the first reference potential,
a third comparator configured to output the first value when the electric potential at the first end of the sense wiring is higher than a second reference potential that is lower than the first reference potential, and to output the second value when the electric potential at the first end of the sense wiring is lower than the second reference potential, and
a fourth comparator configured to output the first value when the electric potential at the first end of the sense wiring is higher than the second reference potential, and to output the second value when the electric potential at the first end of the sense wiring is lower than the second reference potential.

12. The light-emitting module according to claim 11, further comprising a second resistance element electrically connected between the first end of the sense wiring and a circuit that is configured to supply a fifth reference potential, wherein a second end of the sense wiring is electrically connected to a circuit that is configured to supply a sixth reference potential.

13. The light-emitting module according to claim 11, wherein the converting member contains a fluorescent material configured to convert the laser light to light having a wavelength that is different from a wavelength of the laser light.

14. The light-emitting module according to claim 11, further comprising a casing, wherein the laser element is arranged in the casing, and the converting member is arranged on an optical path of the laser light emitted from the laser element.

* * * * *